(12) United States Patent
Wey et al.

(10) Patent No.: US 7,755,177 B2
(45) Date of Patent: Jul. 13, 2010

(54) CARRIER STRUCTURE OF SOC WITH CUSTOM INTERFACE

(75) Inventors: Chin-Long Wey, Hsinchu (TW);
Chun-Ming Huang, Hsinchu (TW);
Chien-Ming Wu, Hsinchu (TW);
Chih-Chyan Yang, Hsinchu (TW);
Wei-De Chien, Hsinchu (TW)

(73) Assignees: National Chip Implementation Center; National Applied Research Laboratories, Hsinchu (TW)

( * ) Notice: Subject to any disclaimer, the term of this patent is extended or adjusted under 35 U.S.C. 154(b) by 0 days.

(21) Appl. No.: 12/292,261

(22) Filed: Nov. 14, 2008

(65) Prior Publication Data
US 2010/0059886 A1 Mar. 11, 2010

(30) Foreign Application Priority Data
Oct. 9, 2008 (TW) .............................. 97139062 A

(51) Int. Cl.
*H01L 23/48* (2006.01)
*H01L 23/52* (2006.01)
*H01L 29/40* (2006.01)

(52) U.S. Cl. .................. 257/678; 257/686; 257/777
(58) Field of Classification Search ......... 257/678–700, 257/724–725, 737–738, 777–795, E23.023
See application file for complete search history.

(56) References Cited

U.S. PATENT DOCUMENTS

2006/0186518 A1 * 8/2006 Wu et al. ................. 257/678

* cited by examiner

*Primary Examiner*—Cuong Q Nguyen
(74) *Attorney, Agent, or Firm*—Stites & Harbison PLLC; Juan Carlos A. Marquez, Esq.

(57) ABSTRACT

The present invention discloses a carrier structure of a System-on-Chip (SoC) with a custom interface. The carrier structure includes a substrate, at least one common die, at least one custom interface and a molding compound. The common die and the custom interface are disposed on the substrate. The molding compound is used to package the common die which electrically connects to the substrate and the custom interface respectively. The carrier structure which includes the common die can form a complete SoC by connecting to an expansive die through the custom interface. The carrier structure with the common die which can be tested and certified in advance allows reducing and simplifying the developing procedures of the SoC.

8 Claims, 7 Drawing Sheets

CARRIER STRUCTURE OF SOC WITH CUSTOM INTERFACE

BACKGROUND OF THE INVENTION

1. Technical Field

The present invention relates to a carrier structure of a System-on-Chip (SoC), and more particularly, to a carrier structure of a SoC with a custom interface.

2. Description of Related Art

A system-on-chip (SoC) is an integrated chip having a complete system. In other words, a SoC is an integrated circuit for particular use. It is common for commercially available electronic products to implement such SoCs for minimizing product size. In addition, a SoC typically comprises assemblies related to operation, such as a digital signal processor core, a microprocessor core, a graphic core and so on, plus a memory, a logic circuit, and an I/O circuit and other connecting circuits. Therefore, the SoC as a whole contains a large number of elements and thus has a complex circuit structure.

However, in view of the trends of electronic products toward shortened life cycle and reduced selling price, approaches for simplifying the developing procedures and effectively controlling the manufacturing costs of the complex SoCs in electronic products would be helpful to increasing market share and product profitability.

In order to cut down manufacturing costs, one modular basic structure may be adopted in the SoCs of various electronic products. For instance, in portable communication devices of different models, the baseband-related assemblies may be composed of common elements having identical specifications. Upon this basic structure, a system developer may add more elements for expanding functions, such as radio frequency (RF) elements and memories in portable communication devices, where a semi-custom concept is realized.

However, since the circuits of SoCs are complicated, in the early stage of development, namely the design process, the required elements and structure are determined by system developers independently, and thus vary from one developer to another. Similarly, the late stage of development, such as the manufacturing, testing and packaging procedures, is mostly finished by system developers independently. Thus, a full custom process is accomplished.

While such full custom process from designing to manufacturing provides system developers with great dominance, the costs of manpower and time it takes are considerable. In view of the increased costs and prolonged development cycle, it is believed that by using a carrier structure adaptive to various SoCs at the late stage, namely the manufacturing procedure, of SoC development, the developing procedures can be efficiently reduced.

SUMMARY OF THE INVENTION

One objective of the present invention is to provide a carrier structure of a SoC with a custom interface, wherein a common die that has been tested and certified in advance is integrated with a substrate so that when the carrier structure is to be connected to an expansive die through the custom interface, only the expansive die has to be tested, thereby reducing developing procedures and manufacturing costs of the SoC.

Another objective of the present invention is to provide a carrier structure of a SoC with a custom interface which uses common dies that may be manufactured by people other than system developers so that the system developers are allowed to focus on designing expansive dies and simply choose suitable carrier structures of SoCs to work with the expansive dies they designed.

An additional objective of the present invention is to provide a carrier structure of a SoC with a custom interface, wherein electrical connection between common dies and a circuit is built in advance so as to reduce the required number of pins on the carrier structure of the SoC for external connection, thereby simplifying the structure of the SoC.

Still another objective of the present invention is to provide a carrier structure of a SoC with a custom interface which enables mass production and is suitable for use by various system developers as a basic structure so as to reduce the manufacturing costs of the SoC.

Yet another objective of the present invention is to provide a carrier structure of a SoC with a custom interface whose production involves only well-developed technologies but no difficult or costly techniques.

To achieve these and other objectives of the present invention, the carrier structure of the SoC with the custom interface comprises: a substrate, at least one common die disposed on and electrically connecting to the substrate, at least one custom interface disposed on and electrically connecting to the substrate and electrically connecting to the common die, and a molding compound used to package the common die.

By practicing the present invention, at least the following advantageous effects can be achieved:

1. Since the carrier structure of the SoC is a semi-finished product equipped with the common die, it helps reduce the developing and testing procedures of the SoC;

2. As a result of the reduced developing procedure, the developing costs of the SoC is reduced; and 3. By integrating the substrate and the common die, the number of pins for external connection can be reduced and the structure of the SoC can be in turn simplified.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENT

Figure 1:
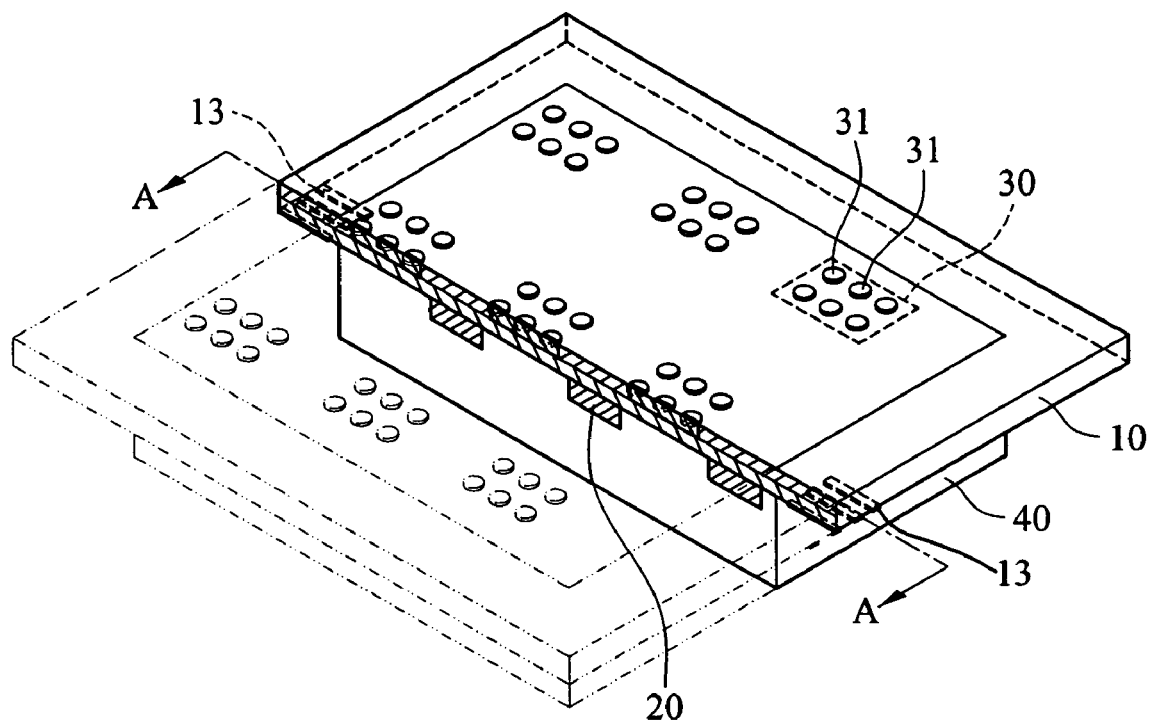
FIG. 1 is a perspective view of a carrier structure of a SoC with a custom interface according to a first embodiment of the present invention.

As shown in FIG. 1, according to a first embodiment of the present invention, a carrier structure 100 of a SoC with a custom interface includes a substrate 10, at least one common die 20, at least one custom interface 30 and a molding compound 40.

Figure 2:
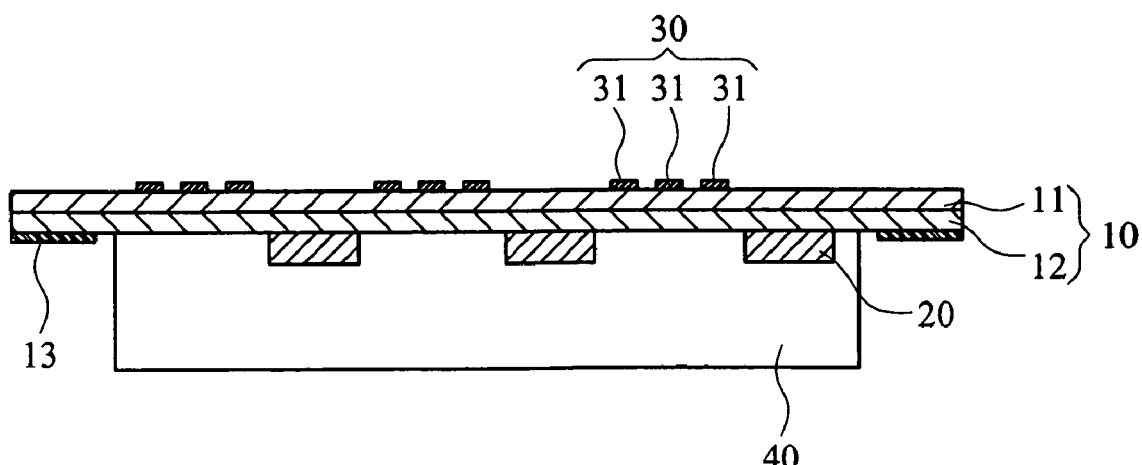
FIG. 2 is a cross-sectional view of the carrier structure taken along Line A-A of FIG. 1.

Referring to FIG. 2, the substrate 10 may be composed of a first circuit layer 11 and a second circuit layer 12. The first circuit layer 11 and the second circuit layer 12 are formed on two surfaces of the substrate 10, respectively, and electrically connect to each other. In another embodiment, the substrate 10 may be a multi-layer substrate having more than two circuit layers.

The common dies 20 are deposited on and electrically connecting to the substrate 10. The carrier structure 100 of the present invention comprises plural said common dies 20, each electrically connected to the substrate 10 by a flip-chip mounting technique, a wire bonding technique or other techniques. When the common dies 20 are in electrical connection with the substrate 10, the common dies 20 can transmit control signals to one another through the circuit structures in the substrate 10, e.g., the first circuit layer 11. Moreover, the common die 20 may be, but not limited to, a memory, a processor, or a bus.

As can be seen in FIG. 2, the custom interfaces 30 are deposited on and electrically connecting to the substrate 10. Thereby, the custom interfaces 30 are capable of transmitting control signals through the circuit structures in the substrate 10, e.g., the second circuit layer 12. Furthermore, since the substrate 10 is in electrical connection with the common dies 20, the custom interfaces 30 are in turn in electrical connection with the common dies 20.

According to FIGS. 1, 3, 4 and 5, each of the custom interfaces 30 can be a mount assembly composed of a plurality of solder bumps 31 and is in electrical connection with each of the common dies 20, respectively.

Seeing FIG. 2, the molding compound 40 is used to package the common dies 20 deposited on the substrate 10 so as to prevent the common dies 20 from being damaged by moisture and external force from a hand touch or the gravity, for example.

Figure 3:
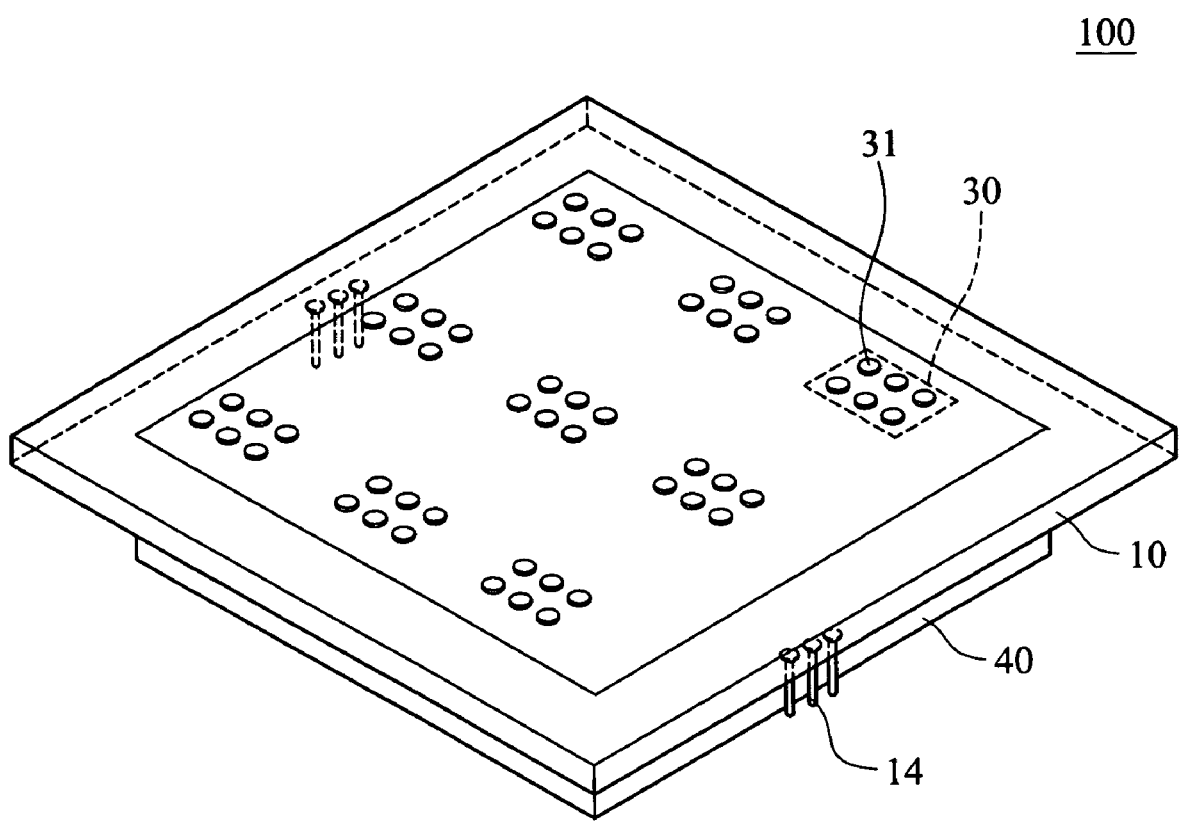
FIG. 3 is a perspective view of a carrier structure of a SoC with a custom interface according to a second embodiment of the present invention.
Figure 4:
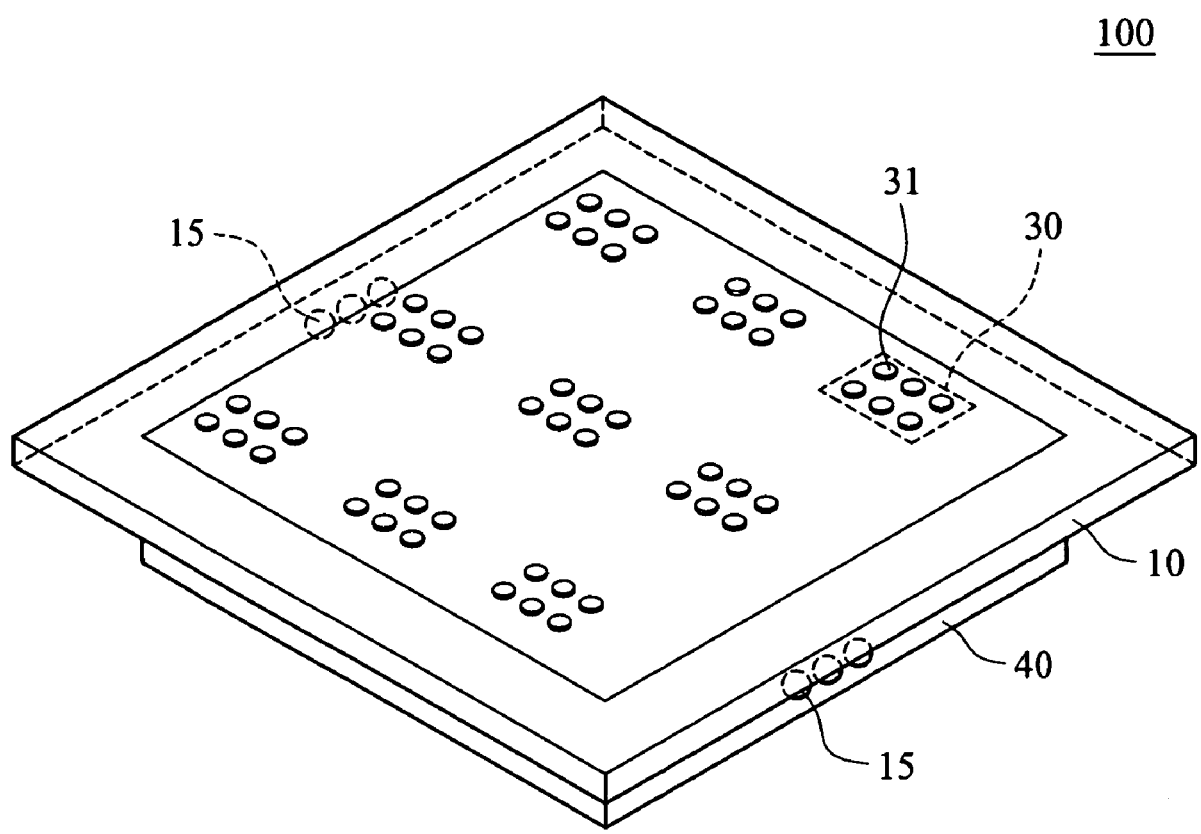
FIG. 4 is a perspective view of a carrier structure of a SoC with a custom interface according to a third embodiment of the present invention.

Referring to FIGS. 1 through 4, the substrate 10 may further comprise and electrically connect to a contacting connector. The contacting connector may be, but not limited to, a contact 13 commonly known as a golden finger (as shown in FIG. 1), a pin array 14 (as shown in FIG. 3), or a ball grid array 15 (as shown in FIG. 4). The contacting connector on the substrate 10 allows the carrier structure 100 of the present invention to electrically connect to external devices so as to achieve signal transmission or power supply.

Because the carrier structure 100 is integrated with the common dies 20 that electrically connect to the substrate 10, the majority of signals for system operation are transmitted inside the substrate 10. Consequently, the carrier structure 100 only needs to be additionally equipped with a few contacting connectors for external connection. As a result, the structure of the SoC is simplified.

Figure 5:
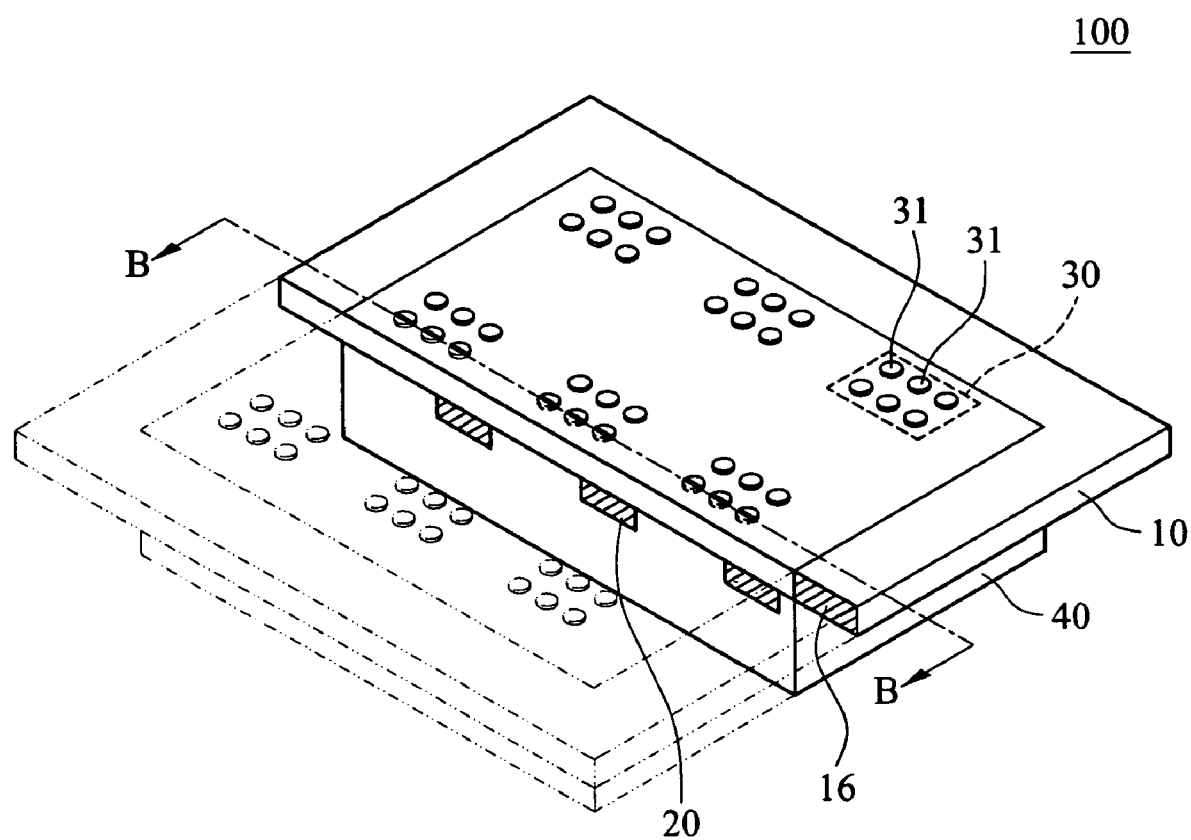
FIG. 5 is a perspective view of a carrier structure of a SoC with a custom interface according to a fourth embodiment of the present invention.
Figure 6:
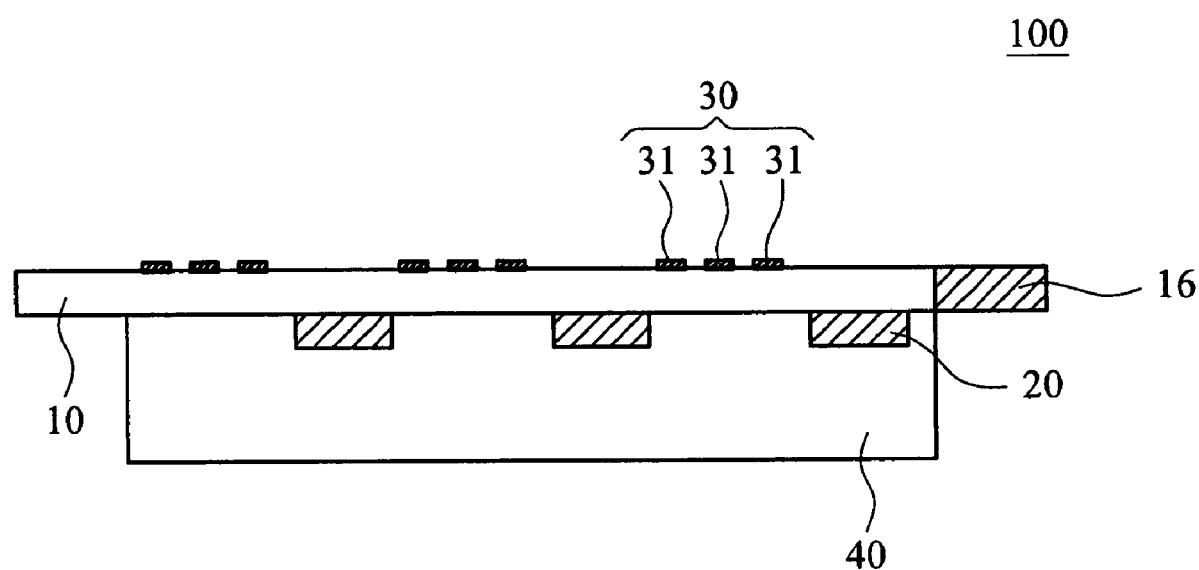
FIG. 6 is a cross-sectional view of the carrier structure taken along Line B-B of FIG. 5.

As shown in FIGS. 5 and 6, the substrate 10 may further comprise and electrically connect to a non-contacting connector, such as a wireless device 16. The non-contacting connector provides more diversified ways of signal transmission between the carrier structure 100 of the present invention and external circuits. Besides, the non-contacting connector may be arranged at any part of the substrate 10. For example, the non-contacting connector may be incorporated in the substrate 10.

Figure 7:
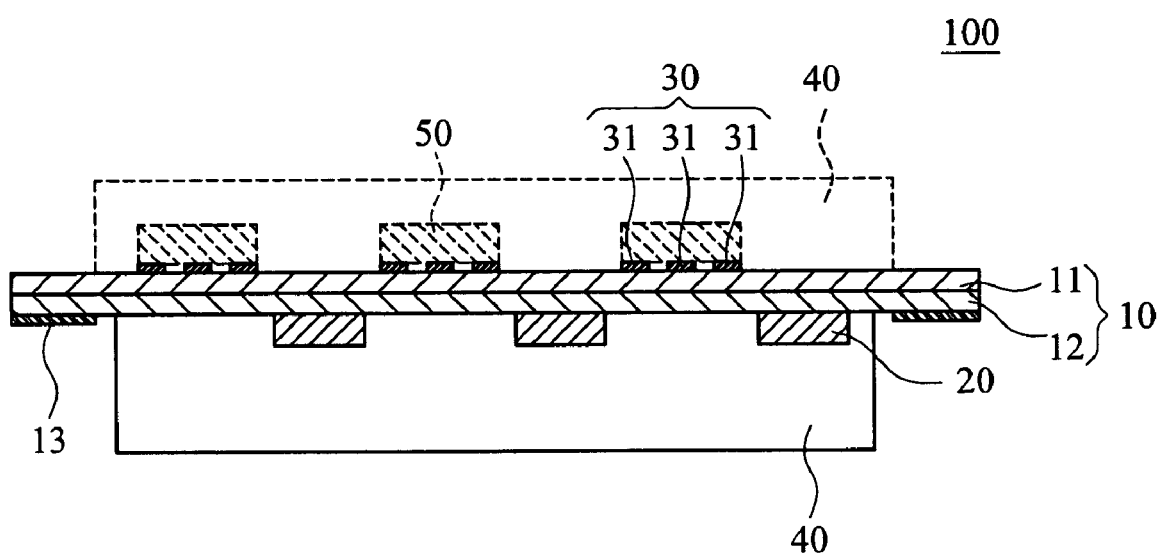
FIG. 7 is a cross-sectional view showing application of the carrier structure according to the present invention.

Referring to FIG. 7, with the custom interfaces 30, the carrier structure 100 of the present invention is allowed to connect to expansive dies 50 having specific functions through the custom interfaces 30 by a flip-chip mounting technique, a wire bonding technique or other techniques. Since the custom interfaces 30 are in electrical connection with the common dies 20, the expansive dies 50 are consequently in electrical connection with the common dies 20. Then the molding compound 40 is used to package the expansive dies 50 so as to form a complete SoC.

The expansive die 50 is hardware designed by the system developer for providing a specific function and can be, but not limited to, a memory, an RF element, or a digital signal processor. Also, the expansive die 50 may be in the form of FPGA (Field Programmable Gate Array), PLA (Programmable Logic Array) or ASIC (Application Specific Integrated Circuit).

Figure 8:
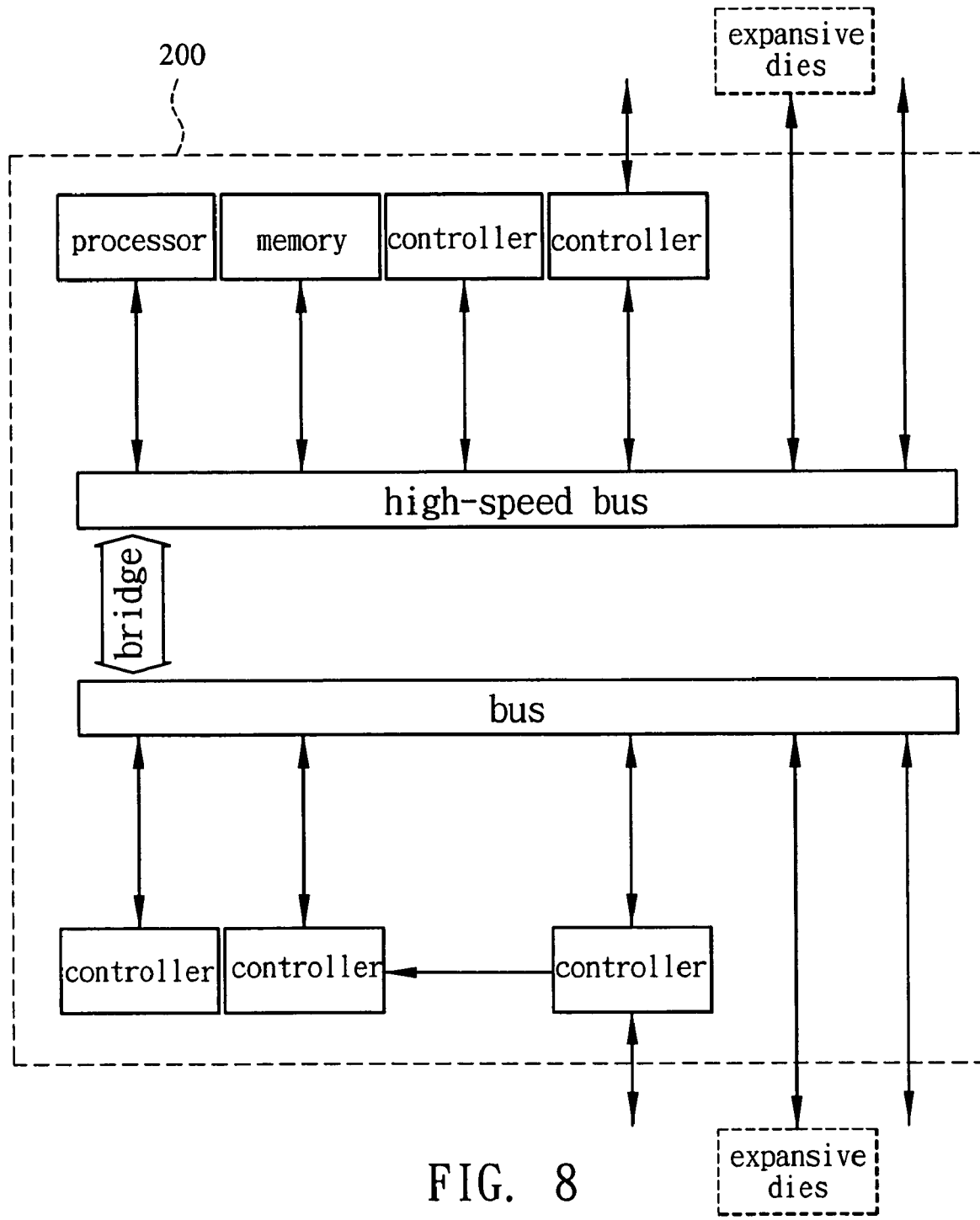
FIG. 8 is a block diagram of a carrier structure of a System-on-Platform with a custom interface according to the present invention.

A plurality of the carrier structures 100 described above can form, through the common dies 20 thereof, a carrier structure 200 of a System-on-Platform having a structure as shown in FIG. 8. The common dies 20 in the carrier structure 200 may be tested and certified in advance. For instance, the carrier structure 200 may comprise various types of the common dies 20 including at least one processor, buses, a bridge for connecting the buses, various memories, controllers corresponding to the memories, controllers for peripherals, circuits for signal transmission, circuits for external connection and so on.

A plurality of the carrier structures 100 may, according to different system demands, form carrier structures 200 with different specifications for providing different functions, so that a system developer can choose the carrier structure 200 of a System-on-Platform best meeting the functions and capabilities of the expansive dies 50 he/she intends to use.

The common dies 20 for building the carrier structures 100 and the carrier structures 200 formed by the carrier structures 100 can be selected as appropriate to suit the need of every system developer.

As the common dies 20 can be tested and certified in advance and can be connect to the expansive dies 50 efficiently through the custom interfaces 30, the evaluation and certification procedures in the manufacturing process of SoCs can be sped up, thereby shortening the development cycle of electronic products. In addition, it is possible to put the carrier structure 100 of the present invention into mass production, so that the manufacturing costs of SoCs can be significantly reduced.

The foregoing embodiments are provided to illustrate the features of the present invention so that a person skilled in the art is enabled to understand and implement the contents disclosed herein. It is understood, however, that the embodiments are not intended to limit the scope of the present invention. Therefore, all equivalent changes or modifications which do not depart from the spirit of the present invention should be encompassed by the appended claims.

What is claimed is:

1. A carrier structure for a System-on-Chip (SoC) device, said carrier structure comprising:
   a substrate having at least one circuit layer formed thereon;
   at least one common die disposed on and electrically connected to the circuit layer of the substrate;

at least one custom interface disposed on and electrically connected to the at least one circuit layer of the substrate so as to be electrically connected to the at least one common die; and a mold compound formed to package the at least one common die, wherein the at least one custom interface is predeterminedly formed to electrically and operatively connect the at least one common die to at least one expansive die, whereby at least the substrate, the at least one common die, the at least one custom interface and at least one expansive die form a complete SoC device.

2. The carrier structure of claim 1, wherein the at least one circuit layer is also a first circuit layer and the substrate further comprises a second circuit layer, the first and second circuit layers being formed on two surfaces of the substrate, respectively.

3. The carrier structure of claim 1, wherein the substrate further comprises and electrically connects to an external contacting connector.

4. The carrier structure of claim 3, wherein the external contacting connector is a golden finger.

5. The carrier structure of claim 3, wherein the external contacting connector is a pin array.

6. The carrier structure of claim 3, wherein the external contacting connector is a ball grid array.

7. The carrier structure of claim 1, wherein external contacting connector is a non-contacting connector for a wireless device.

8. The carrier structure of claim 1, wherein the at least one custom interface is a mount assembly formed to electrically and operatively connect the at least one common die to the expansive die.

* * * * *

UNITED STATES PATENT AND TRADEMARK OFFICE
CERTIFICATE OF CORRECTION

PATENT NO. : 7,755,177 B2
APPLICATION NO. : 12/292261
DATED : July 13, 2010
INVENTOR(S) : Wey et al.

Page 1 of 1

It is certified that error appears in the above-identified patent and that said Letters Patent is hereby corrected as shown below:

On the Title page, Item (75) "Inventors", please delete:

"Chih-Chyan Yang" and insert: -- Chih-Chyau Yang --

Signed and Sealed this

Fourth Day of January, 2011

David J. Kappos
*Director of the United States Patent and Trademark Office*